United States Patent [19]
Cooper

[11] 3,944,853
[45] Mar. 16, 1976

[54] VIDEO RECORDER PRE-EMPHASIS, DE-EMPHASIS CIRCUITS

[75] Inventor: Eugene A. Cooper, Placentia, Calif.

[73] Assignee: BASF Aktiengesellschaft, Ludwigshafen (Rhine), Germany

[22] Filed: Aug. 12, 1974

[21] Appl. No.: 496,849

[52] U.S. Cl. .............. 307/237; 307/268; 328/167; 328/171; 360/67
[51] Int. Cl.². H03K 5/08; H04B 1/10; H04B 1/62; H04N 5/78
[58] Field of Search........ 307/237; 179/1 P; 325/45, 325/46, 62, 65; 328/167, 171; 333/14; 360/67, 68

[56] References Cited
UNITED STATES PATENTS

| | | |
|---|---|---|
| 3,013,116 | 12/1961 | Sziklai et al. .................. 307/237 X |
| 3,268,658 | 8/1966 | Schroeder et al. ............... 307/237 X |
| 3,288,930 | 11/1966 | Johnson ................................ 179/1 P |
| 3,621,284 | 11/1971 | Cluett et al. ........................ 307/237 |
| 3,665,345 | 5/1972 | Dolby .................................. 307/237 X |
| 3,716,726 | 2/1973 | Trimble ............................... 307/237 |
| 3,764,917 | 10/1973 | Rhee ................................... 307/237 X |

*Primary Examiner*—Stanley D. Miller, Jr.
*Assistant Examiner*—L. N. Anagnos

[57] ABSTRACT

Improved circuits for pre-emphasis and de-emphasis of video luminance signals, the improvement comprising the utilization of field effect transistors in a non-linear frequency-discriminating network; and automatic circuitry useful in both recording and reproduction of recorded video information.

4 Claims, 2 Drawing Figures

VIDEO RECORDER PRE-EMPHASIS, DE-EMPHASIS CIRCUITS

BACKGROUND OF THE INVENTION

Pre-emphasis, de-emphasis circuits are known for improving the signal to noise ratio in wide band signal transfer circuits. Johnson, U.S. Pat. No. 3,288,930, issued Nov. 29, 1966, describes circuits for pre-emphasis and de-emphasis of video signals. These circuits utilize diodes in a non-linear frequency-discriminating portion thereof to attenuate or accentuate the amplitudes of high-frequency, high-amplitude signals.

Diodes, such as used in the Johnson patent, have numerous disadvantages. It is difficult to match the characteristics of discrete diodes, which is a necessity for production of pre-emphasis and de-emphasis circuits utilizing such diodes. Diodes also have unknown capacitive components in their transfer characteristics which cannot be readily compensated for in the design of pre-emphasis, de-emphasis circuits.

The use of field effect transistors (FET) circumvents the disadvantages inherent in diodes, and they have additional advantages. The capacitive reactance of FETs is sufficiently small as to be negligible when the devices are utilized in pre-emphasis, and de-emphasis circuits. Also, the characteristics from one FET to another are sufficiently reproducible as to allow their use in production situations without the necessity for highly skilled personnel to match the characteristics of the components. A further advantage of the FET is the ability to control the operating point by simply varying the control gate voltage.

It is an object of this invention to produce pre-emphasis and de-emphasis circuits having improved control characteristics.

A second object of the invention is to eliminate the problematic capacitive reactance present with the utilization of diodes.

A further object of the invention is to develop circuits which can be constructed in a production situation without the necessity for skilled personnel to carefully match characteristics of the circuit components.

SUMMARY OF THE INVENTION

Disclosed herein are improved circuits for pre-emphasis, de-emphasis of wide band video signals utilizing FETs in the limiter portion of the circuit. Through U.S. Pat. No. 3,288,930 to W. R. Johnson, for example, it is known, in a wide band signal transfer circuit, to utilize a pre-emphasis portion having a frequency response characteristic, or transfer function, accentuating the components of the transferred signal as a continuous direct function of its frequency. Such known circuits utilize a non-linear frequency-discriminating portion, in the present instance an attenuating circuit or limiter, coupled to the pre-emphasis portion and having an amplitude response characteristic which non-linearly accentuates the attenuation of high-frequency signals of high amplitude. According to the invention this attenuating circuit includes FETs.

It is also known in wide band signal transfer circuits to have a de-emphasis portion having a frequency response characteristic de-emphasizing the components of the transferred signal as a continuous direct function of its frequency. Such circuits have a non-linear frequency-discriminating portion coupled to the de-emphasis portion having an amplitude response characteristic non-linearly accentuating high-frequency signals of high amplitude. The improved circuit herein disclosed utilizes FETs in the frequency-discriminating portion of such a de-emphasis circuit.

DETAILED DESCRIPTION OF THE EMBODIMENTS

Figure 1:
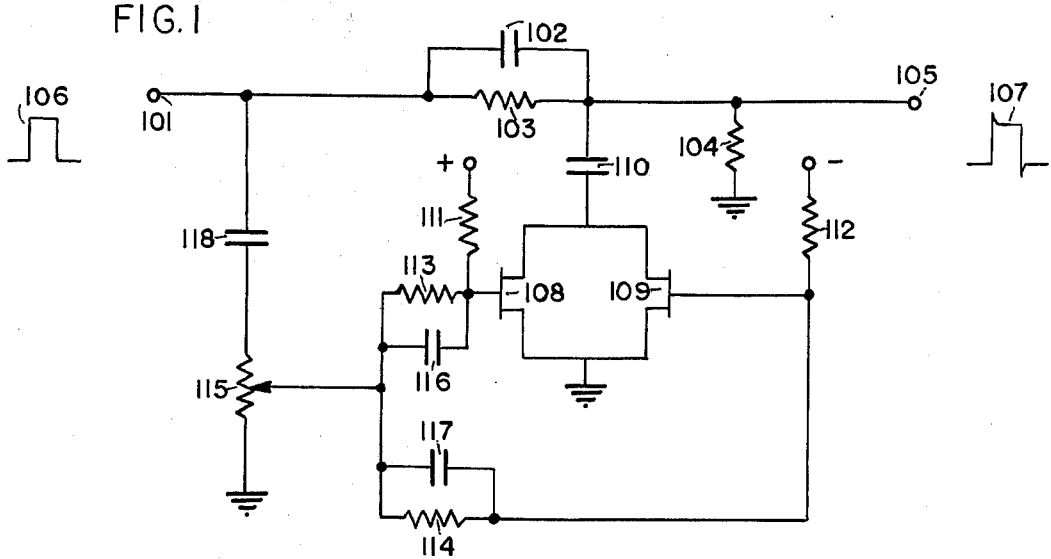
FIG. 1 is a pre-emphasis circuit schematic utilizing an FET frequency-discriminating portion.

FIG. 1 shows an improved pre-emphasis circuit utilizing FETs. The general operation of such circuits is known from the Johnson patent, and will not be discussed in detail. A signal entering at terminal 101 is pre-emphasized by capacitor 102, resistor 103 and resistor 104. Such pre-emphasized signal is transmitted at output terminal 105 to other suitable electronics or to a suitable video record portion. The effect of the pre-emphasis portion is shown by input square wave signal 106 and output pre-emphasized signal 107. It should be noted that a square wave closely resembles the luminance portion of the video signal when a dark-to-light edge is passed.

When the incoming video signal 106 is of small amplitude FETs 108 and 109 are non-conductive. However, when the incoming video signal 106 is of large amplitude and high frequency, the FETs 108 and 109 are conductive, placing capacitor 110 in a shunting relationship to resistor 104. The circuit is so adjusted and the capacitor 110 is so chosen as to create an amplitude and frequency sensitive switch having the same attenuating factor as the low frequency part of the small signal transfer function of the pre-emphasis portion of the circuit. Resistors 111 and 112 serve to bias the gates of FETs 108 and 109. The bias of FETs 108 and 109 is further effected by resistors 113, 114 and variable resistor 115. The capacitors 116 and 117 serve to shunt high frequency components around resistors 113 and 114. The input signal 106 appears across resistor 115 and capacitor 118, and thereby, high-frequency components of signal 106 serve to vary the bias point of FETs 108 and 109. The effect of this bias arrangement is to yield a limiter circuit having approximately logarithmic characteristics.

Figure 2:
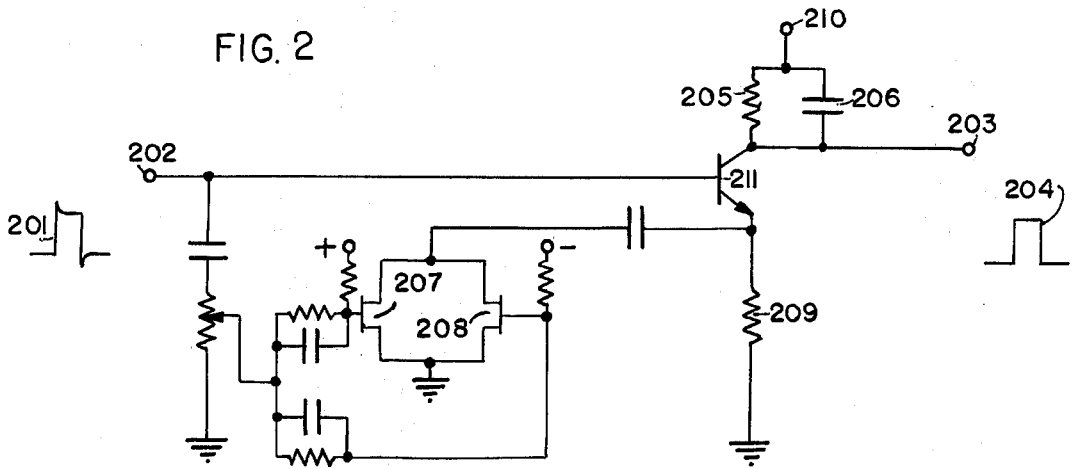
FIG. 2 is a de-emphasis circuit schematic utilizing an FET frequency-discriminating portion.

FIG. 2 shows a de-emphasis circuit for utilization in the playback of recorded pre-emphasized video signals. A circuit of this kind using diodes in its non-linear frequency-discriminating portion is known from the Johnson patent. The circuit is considerably improved by the utilization of the above described FET frequency-discriminating circuit. Pre-emphasized signal 201 at input terminal 202 yields at output terminal 203 a square wave 204. It should be noted that square wave 204 has a slight overshoot at its leading and trailing edges. The purpose of the incomplete removal of the pre-emphasis is to obtain a better defined edge in the video picture in passing a light-to-dark or dark-to-light edge, but this is not a necessary feature of the invention. Resistor 205 and capacitor 206 serve to de-emphasize the input signal 201 in a known manner. The frequency-discriminating circuit incorporating FETs 207 and 208 serves to shunt degenerative emitter resistor 209 for high-frequency signals of large amplitudes, thereby accentuating these signals. The operation of this frequency-discriminating circuit and its bias is the same as that of the limiter circuit described above. Terminal 210 is used to supply bias voltage to transistor 211. The overall effect of the use of FIG. 2 in conjunction with FIG. 1 is a circuit having a substantially constant attentuation or a substantially unity transfer function.

It is obvious to those skilled in the art that the circuit improvements described herein can be applied to signal transfer circuits other than in video recording, and the embodiments described herein are for the purpose of illustration and are not meant to limit the invention in any manner.

We claim:

1. In a wide band signal translating arrangement a pre-emphasizing circuit comprising a pre-emphasis network with a frequency response characteristic accentuating the high-frequency components of a translated signal as a continuous direct function of its frequency and, coupled to said pre-emphasis network, a frequency-discriminating network having an amplitude response characteristic non-linearly accentuating attenuation of high-frequency signals of high amplitude,
    said frequency discriminating network including the series combination of a capacitor and the source-electrode/drain-electrode path of at least one field effect transistor, said combination being connected in shunt relation to the output side of said circuit and the gate-electrode of said field effect transistor being connected to the input side of said circuit.

2. In a wide band signal translating arrangement the pre-emphasizing circuit as claimed in claim 1 wherein said non-linear frequency discriminating network includes two complementary field effect transistors; wherein a capacitor-resistor series combination is connected in shunt relation to the input side of said circuit; and wherein a direct current bias circuit is connected to the gate electrodes of said two field effect transistors, the midpoint of said bias circuit being connected to said resistor.

3. In a wide band signal translating arrangement a de-emphasizing circuit comprising a de-emphasis network with a frequency response characteristic de-emphasizing the high-frequency components of a translated signal as a continuous direct function of its frequency, and, coupled to said de-emphasis network through a transistor device, a frequency discriminating network having an amplitude response characteristic non-linearly accentuating high-frequency signals of high amplitude;
    said transistor device having its base electrode connected to the input of said circuit, its emitter connected to a degenerative emitter resistor and its collector connected to said de-emphasis network and to the output of said circuit; and
    said frequency discriminating network including the series combination of a capacitor and the source-electrode/drain-electrode path of at least one field effect transistor, said combination being connected in shunt relation to said degenerative emitter resistor and the gate-electrode of said field effect transistor being connected to the input of said circuit.

4. In a wide band signal translating arrangement the de-emphasizing circuit as claimed in claim 3 wherein said non-linear frequency discriminating network includes two complementary field effect transistors; wherein a capacitor-resistor series combination is connected in shunt relation to the input of said circuit; and wherein a direct current bias circuit is connected to the gate electrodes of said two field effect transistors, the midpoint of said bias circuit being connected to said resistor.

* * * * *